(12) United States Patent
Rault

(10) Patent No.: US 6,373,319 B1
(45) Date of Patent: Apr. 16, 2002

(54) BISTABLE HIGH-VOLTAGE BIDIRECTIONAL SWITCH

(75) Inventor: Pierre Rault, Saint Cyr sur Loire (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/587,940

(22) Filed: Jun. 6, 2000

(30) Foreign Application Priority Data

Jun. 18, 1999 (FR) .............................................. 99 07977

(51) Int. Cl.[7] .............................................. H03K 17/13
(52) U.S. Cl. ........................ 327/452; 327/455; 327/457
(58) Field of Search ................................. 327/452, 453, 327/455, 457, 469, 470, 472, 473, 476, 446, 456, 458, 459; 323/319, 321, 322; 363/126, 128, 142, 143; 361/100; 307/130

(56) References Cited

U.S. PATENT DOCUMENTS

| | | | | |
|---|---|---|---|---|
| 3,644,739 A | * | 2/1972 | Ilk ............................. | 327/455 |
| 3,648,076 A | * | 3/1972 | Lester ......................... | 327/476 |
| 3,649,849 A | * | 3/1972 | McGuirk, Jr. ................ | 327/476 |
| 3,715,623 A | * | 2/1973 | Szabo ......................... | 327/458 |
| 4,031,528 A | * | 6/1977 | Harrison ...................... | 327/446 |
| 4,360,743 A | * | 11/1982 | Stokes ......................... | 327/455 |

FOREIGN PATENT DOCUMENTS

DE      A-18 06 860      5/1970

OTHER PUBLICATIONS

Berlioux R: "L'alternistor, thyristor bidirectionnel, principles et applications" Electronique Industrielle, No. 118, Nov. 1968, pp. 701–704, Paris, France.

* cited by examiner

Primary Examiner—Terry D. Cunningham
Assistant Examiner—Paul Dinh
(74) Attorney, Agent, or Firm—Wolf, Greenfield & Sacks, P.C.; James H. Morris

(57) ABSTRACT

A high-voltage bidirectional switch, including a high-voltage bidirectional switching element, and circuitry for making the switching element bistable and controllable by, at most, two low-voltage pulse signals.

6 Claims, 3 Drawing Sheets

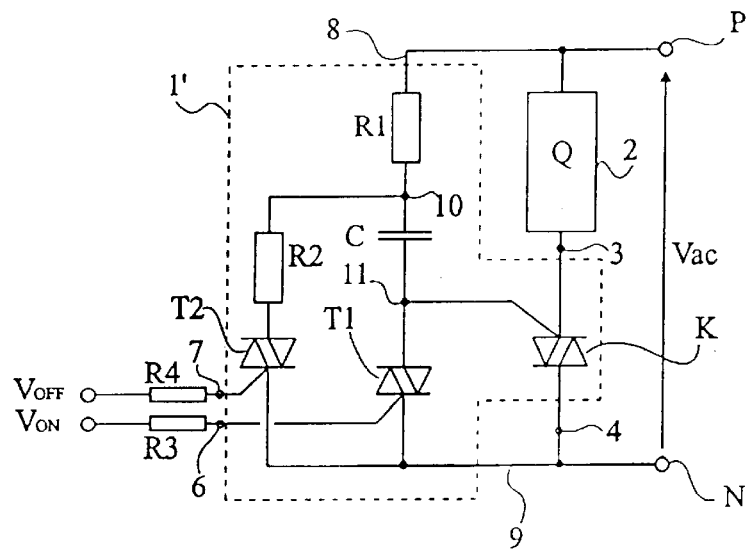
Fig 3
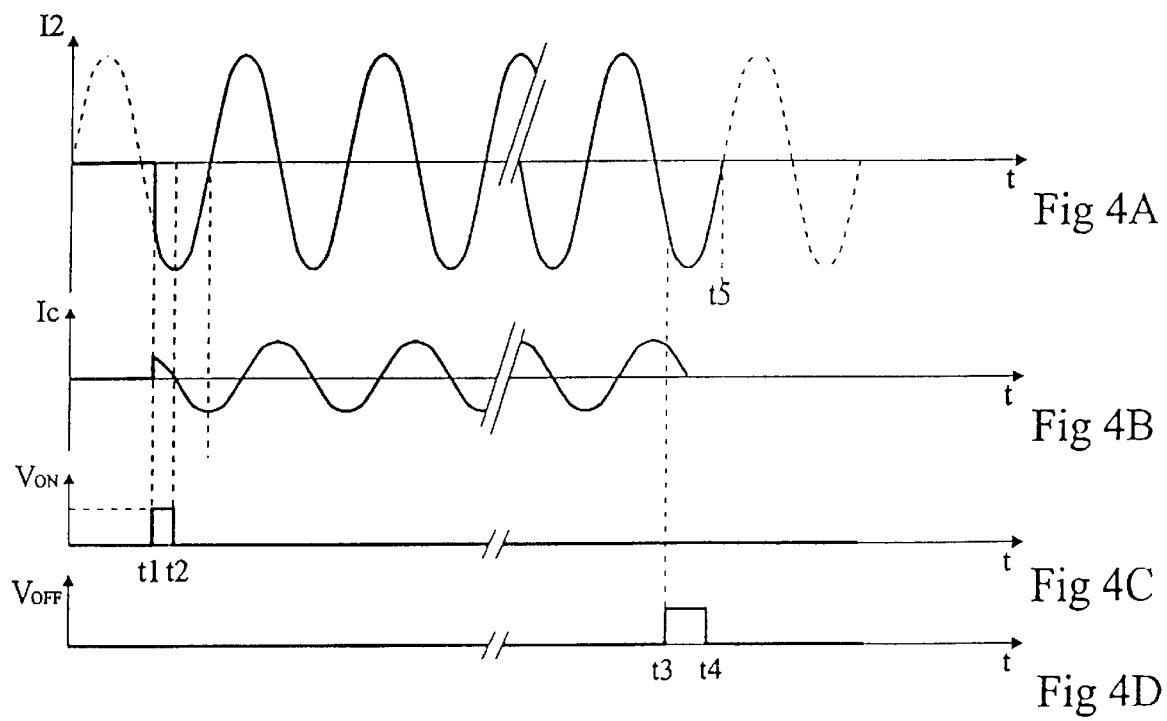
Fig 4A
Fig 4B
Fig 4C
Fig 4D
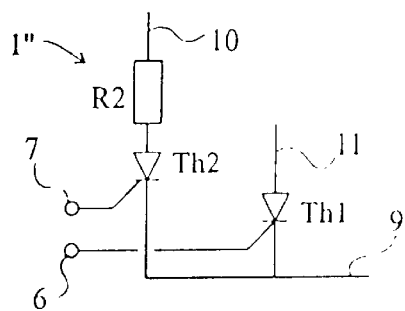
Fig 5

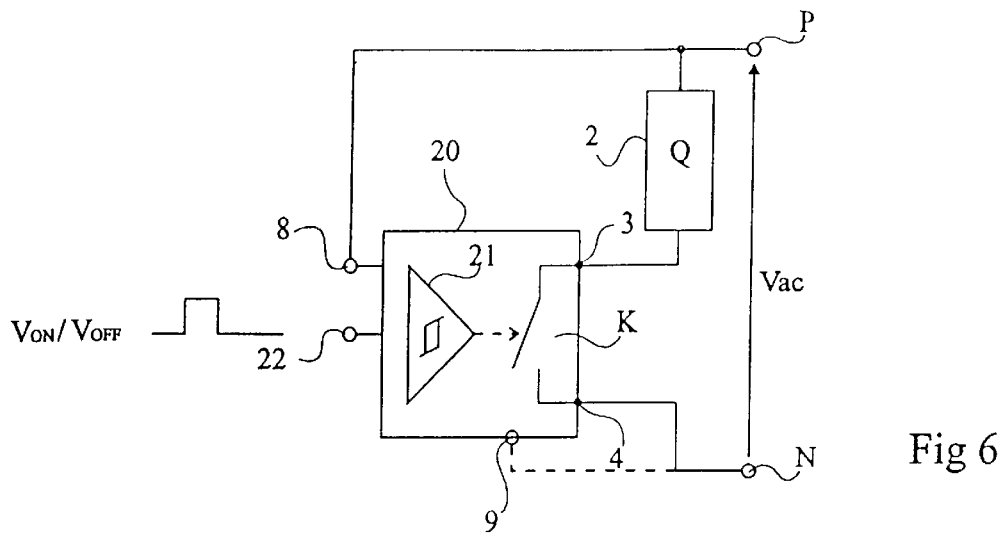
Fig 6
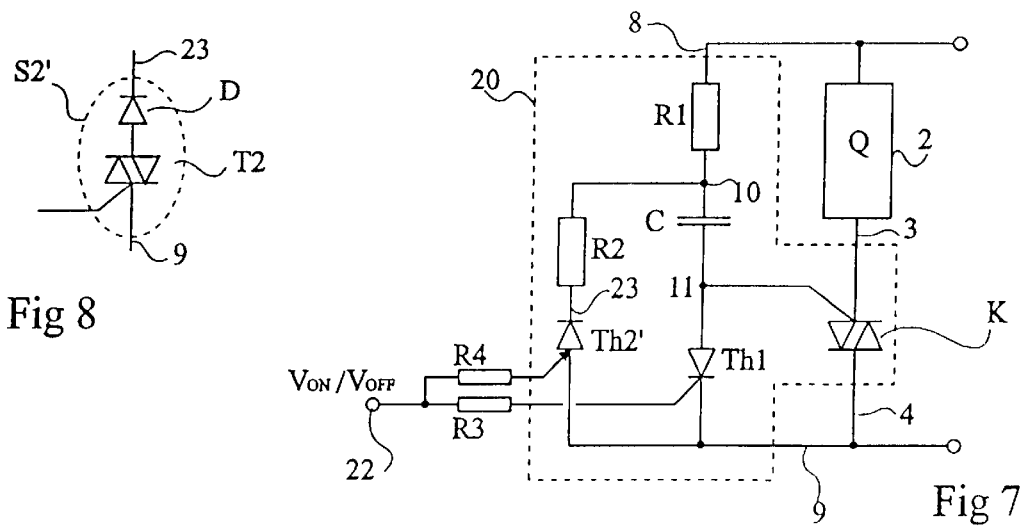
Fig 8
Fig 7
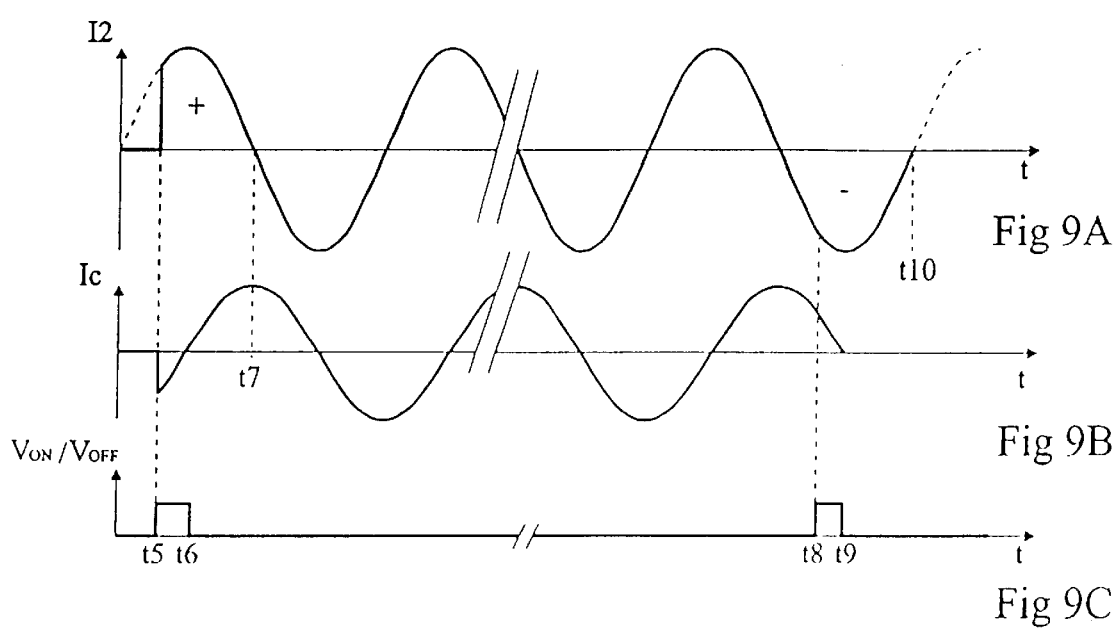
Fig 9A
Fig 9B
Fig 9C

BISTABLE HIGH-VOLTAGE BIDIRECTIONAL SWITCH

BACKGROUND Of THE INVENTION

1. Field of the Invention

The present invention relates to high-voltage bidirectional switches controllable by a low-voltage signal. The present invention more specifically relates to bidirectional switches connected in series with a load supplied by a high A.C. voltage, for example the mains and, among such switches, those that are controllable to be turned off and on.

2. Discussion of the Related Art

High-voltage switches for an A.C. load of the type to which the present invention applies are used, in particular, each time an interface circuit between a low-voltage control system, for example a microcontroller, and a load to be supplied by an A.C. high voltage, for example, an engine, a heating resistor, etc., is required.

An example of application of the present invention relates to electric household appliances, for example washing machines, in which several loads (engines, pumps, heating resistors, valves) are to be controlled from the machine microcontroller.

Generally, a bidirectional switch adapted to being controlled by a low-voltage signal is formed of a triac, the two power terminals of which are on the load supply line and the gate of which receives a low-voltage control signal.

A problem that arises with a triac is that it must be started for each halfwave of the supply voltage since it blocks (is non-conducting) when the current disappears between its two power terminals. Further, it is generally impossible to control the triac with a pulse signal at the mains frequency, in particular for small loads, since the hold and turn on currents of a triac are then of the same order of magnitude (some ten milliamperes) as the current in the load. Accordingly, in conventional systems, a D.C. signal is applied on the triac gate as long as it must be on.

A disadvantage is that this D.C. signal, generally provided by a microcontroller that draws its power from a low-voltage power supply, results in continuous power consumption.

Another disadvantage is that the supply circuit then dissipates a significant mount of power, since a voltage conversion from the A.C. supply voltage (for example, he mains) is most often used.

Finally, when one or several triacs are intended for being controlled by a microcontroller, this control by D.C. signals over the entire duration of the on periods monopolizes the microcontroller.

It would be desirable to have a high-voltage bidirectional switch that can be controlled by a low-voltage signal without generating significant power dissipation from the control circuit.

It would also be desirable to minimize the time of use of the control microcontroller, if present.

SUMMARY OF THE INVENTION

Thus, the present invention aims at providing a novel high-voltage bidirectional switch for controlling an A.C. load that can be controlled by low-voltage pulses, so that a first pulse can turn on the switch and that the switch remains on until a second pulse turns it off, whereby the switch is bistable.

The present invention also aims at providing a switch in which the power dissipation and the consumption is reduced or minimized.

To achieve these and other objects, the present invention provides a high-voltage bidirectional switch, including a high-voltage bidirectional switching element; and means for making the switching element bistable and controllable by, at most, two low-voltage pulse signals.

According to an embodiment of the present invention, the frequency of the pulse signals is small as compared to the frequency of the high A.C. voltage, the duration of the pulses being short as compared to the period of this high A.C. voltage.

According to an embodiment of the present invention, said means include two elementary switches and a capacitor to store a sufficient energy to restart the bidirectional switching element upon each halfwave of the high voltage.

According to an embodiment of the present invention, the capacitor is connected in series with a resistor and a first elementary switch between two terminals of the switch adapted for receiving the high A.C. voltage, the first elementary switch being intended for causing, by its turning on, the turning-on of the bidirectional switching element.

According to an embodiment of the present invention, a second elementary switch is series-connected with a second resistor, this series connection being connected in parallel with the series connection of the capacitor and of the first elementary switch, the second elementary switch being intended for, upon its turning on, discharging the capacitor to prevent an automatic restarting of the bidirectional switching element.

According to an embodiment of the present invention, the two elementary switches are controlled by a single control signal, each elementary switch being unidirectional and corresponding to a specific conduction direction.

According to an embodiment of the present invention, the single control signal is synchronized on the high A.C. voltage, the pulses appearing for a first sign of the halfwaves being intended for turning on the switch and the pulses appearing for a second halfwave sign being intended for turning it off.

The foregoing objects, features and advantages of the present invention, will be discussed in detail in the following non-limiting description of specific embodiments in connection with the accompanying drawings.

BRIEF DESCRIPTION OF THE DRAWINGS

FIG. 3 shows a second embodiment of a switch according to the first aspect of the present invention;

FIGS. 4A to 4D illustrate, in the form of timing diagrams, the operation of the switch of FIG. 3;

FIG. 5 partially shows a third embodiment of a switch according to the first aspect of the present invention;

FIG. 6 shows, in the form of blocks, an embodiment of a switch according to a preferred second aspect of the present invention;

FIG. 7 shows a first embodiment of a switch according to the second aspect of the present invention;

FIG. 8 is a partial view of a detail of FIG. 7 according to a second embodiment of the switch according to the second aspect of the present invention; and FIGS. 9A to 9C illustrate, in the form of timing diagrams, the operation of a switch according to the second aspect of the present invention.

DETAILED DESCRIPTION

Figure 1:
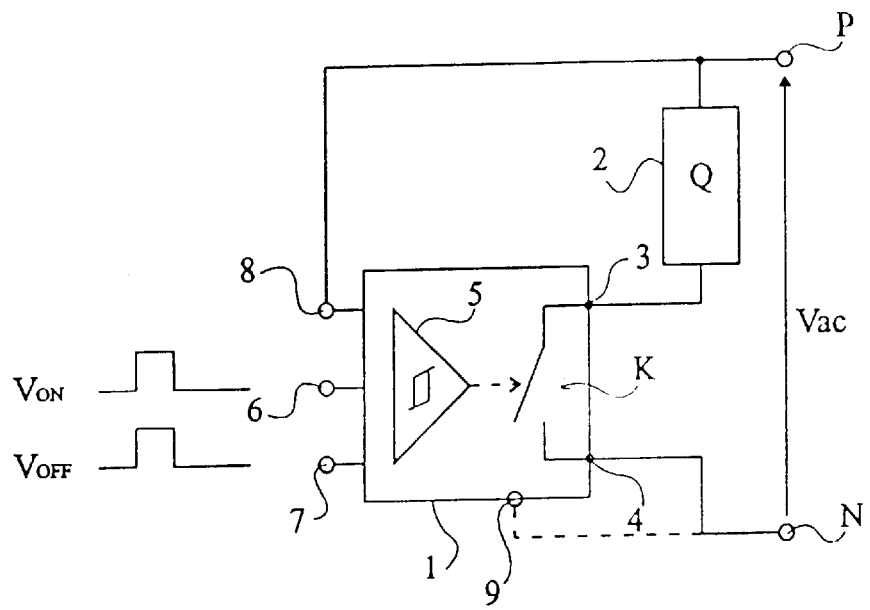
FIG. 1 shows in the form of block diagrams an embodiment of a high-voltage bidirectional switch according to the present invention.

The same elements have been designated by same references in the different drawings. For clarity, only those elements that are necessary to the understanding of the present invention have been shown in the drawings and will be described hereafter. In particular, the A.C. load to be controlled by the switch of the present invention has not been detailed.

A feature of the present invention is to associate, to form a high-voltage bidirectional switch capable of being controlled by a low-voltage signal, a conventional bidirectional switching element with means for making the switch bistable and controllable, at most, by two low-voltage pulse signals.

Another feature of the present invention is that the power required to maintain the switch in a given state is taken from the high A.C. supply voltage.

FIG. 1 shows an embodiment of a switch 1 according to a first aspect of the present invention. This switch is intended to be controlled by two low-voltage pulse signals $V_{ON}$, $V_{OFF}$ according to whether it is desired to switch it to its off or on state.

Switch 1 essentially includes a high-voltage bidirectional switching element K adapted to be series-connected with a load 2 (Q) to be controlled. Thus, switch 1 includes two power terminals 3, 4 intended for being interposed on a supply line of load 2, for example, between a terminal of load 2 and neutral N of an A.C. supply voltage Vac, the other terminal of load 2 being connected to phase P of voltage Vac.

Switching element K is, preferably, a triac that forms a particularly simple embodiment of a high-voltage bidirectional switch.

Element K is controlled by a circuit 5 adapted to hold its on or off state even after disappearance of a control signal having caused this state by being applied on one of the two low-voltage input terminals 6, 7 of switch 1.

Further, switch 1 includes a terminal 8 connected, in this example, to phase P of the A.C. power supply. Terminal 8 is intended for providing circuit 5 with the means for maintaining the state of element K based on the high A.C. supply voltage. The neutral is sampled from terminal 4 connected to a terminal 9 of switch 1.

Figure 2:
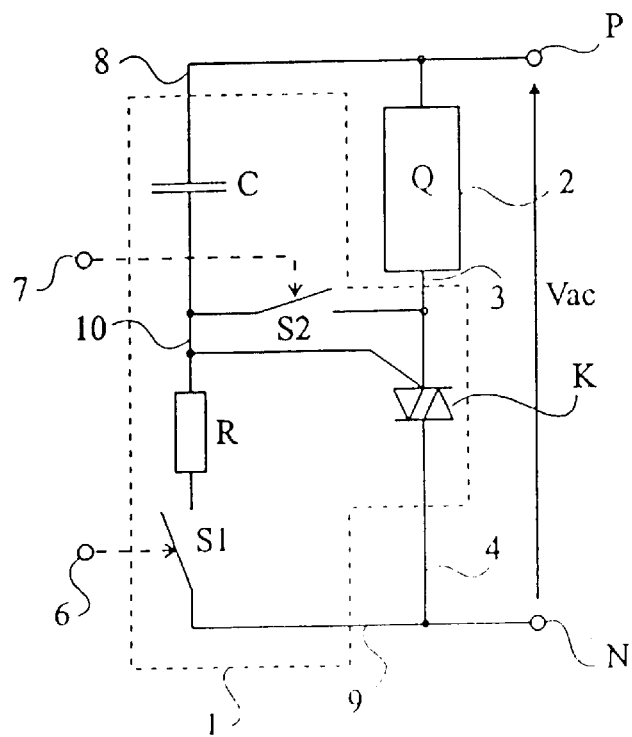
FIG. 2 schematically shows a first embodiment of the switch of FIG. 1.

FIG. 2 shows a first embodiment of switch 1. Switching element K is formed of a triac, the power terminals of which define terminals 3, 4 of switch 1. Control circuit 5 here is formed of two elementary switches S1 and S2 connected to a capacitor C and to a resistor R. Capacitor C, resistor R and elementary switch S1 are series-connected between terminals 8 and 9 of A.C. supply voltage Vac. Elementary switch S2 is connected between a node 10, of connection of capacitor C to resistor R, and terminal 3. The gate of triac K also is connected to node 10.

In the embodiment of FIG. 2, it is assumed that elementary switch SI is controlled by signal $V_{ON}$ applied on terminal 6, that is, the turn-on control signal of the switch, while elementary switch S2 is controlled by signal $V_{OFF}$ applied to terminal 7, that is, the turn-off control signal of switch 1. The operation of the switch of FIG. 2 is the following.

It is assumed that initially, capacitor C is discharged and elementary switches S1 and S2 are both off, no control pulse being applied on terminals 6 and 7. Accordingly, when A.C. voltage Vac is applied between terminals P and N, no current flows through load 2. Indeed, capacitor C being discharged, no current can flow from power terminal 3 of triac K through its gate and the triac thus cannot start.

To turn switch 1 on, a pulse is applied on terminal 6 to turn elementary switch S1 on for a predetermined duration. When elementary switch Si is closed, a current flows through load 2, from power terminal 3 of triac K to its gate, into resistor R and into elementary switch S1. The duration of the turn-on pulse of elementary switch S1 is chosen according to the current required to start triac K so that said triac be started before elementary switch S1 is turned back off by the disappearing of the pulse on terminal 6.

By the closing of elementary switch S1, capacitor C is charged substantially to ground N on terminal 10 (neglecting the voltage drops in resistor R and in elementary switch S1 in the closed state). It should be noted that the current through capacitor C is phase-shifted by 90° with respect to voltage Vac.

The duration of the turn-on pulse of switch S1 is shorter than the half-period of voltage Vac so that this pulse has disappeared at the end of the halfwave of voltage Vac having caused the starting of triac K. When voltage Vac of the next halfwave starts increasing (or decreasing), a current flows through capacitor C, either because the potential of terminal N decreases (negative halfwave) or because the potential of terminal P increases (positive halfwave). Accordingly, this current flowing through capacitor C is used to restart triac K upon each halfwave. For a proper operation of switch 1, the capacitance of capacitor C must be such that said capacitor provides a sufficient current to start the triac upon each halfwave.

As a specific example of embodiment, for a triac having a starting current on the order of 1 milliampere, and for a voltage Vac of 220 volts at a 50-hertz frequency, a capacitor C having a capacitance on the order of 10 nF is adequate.

Switch 1 remains steadily on, that is, triac K is automatically turned back on upon each halfwave of supply Vac. Further, the recharge of capacitor C upon each halfwave is obtained by only drawing power from voltage Vac.

It should be noted that the present invention takes advantage of the current phase shift in capacitor C with respect to voltage Vac so that the current in the capacitor is never null upon zero crossings of voltage Vac. This condition is necessary to enable restarting triac K upon each halfwave.

To turn off switch 1, a pulse of predetermined duration is applied on terminal 7 to close elementary switch S2 for a sufficient duration to discharge capacitor C.

It should be noted that switch S2 must be closed until the end of the halfwave of voltage Vac to avoid for capacitor C to recharge.

Since the capacitor is discharged, switch 1 is then in a steady state again, but this time, off.

In practice, elementary switches S1 and S2 of the switch of FIG. 2 may be formed, for example, of triacs or of thyristors. For the control of switch S2, an optocoupler or the like will be used to have a voltage reference enabling control of the triac or thyristor forming this elementary switch. Indeed, in the assembly of FIG. 2, none of the power terminals of switch S2 is connected to a potential that could be used as a common reference with that of the pulse control signal as is the case for switch S1.

FIG. 3 shows a second embodiment of a switch 1' based on the first aspect of the present invention illustrated by FIG. 1. This embodiment especially aims at avoiding using an optocoupler or the like to control the second elementary switch of switch 1 of FIG. 2. This embodiment also aims at reducing or minimizing the switch power consumption.

As previously, switch 1' includes a triac K, the power terminals of which define terminals 3 and 4 of the switch.

Still like in the embodiment of FIG. 2, a resistor R1, a capacitor C and a first elementary switch, here a triac T1, are series-connected between terminals 8 and 9 of switch 1'. However, in this embodiment, capacitor C is arranged in the middle of the series connection, that is, between resistor R1 and triac T1. The gate of triac K is then connected to the junction point 11 of triac T1 and capacitor C.

According to this embodiment, a second elementary switch, here a triac T2, is series-connected with a resistor R2 between node 10 of connection of resistor R1 to capacitor C, and terminal 9, a power terminal of triac T2 being connected to terminal 9.

The respective gates of triacs T1 and T2 are connected to terminals 6 and 7 of switch 1' that receive, for example via current-to-voltage conversion resistors R3, R4, pulse control voltages $V_{ON}$ and $V_{OFF}$.

The operation of switch 1' of FIG. 3 is illustrated by FIGS. 4A to 4D that show, respectively, an example of shape of currents I2 and Ic respectively through load 2 and through capacitor C, for an example of control signals $V_{ON}$ and $V_{OFF}$.

In FIG. 4A, the shape of the current through load 2 if said load was permanently on has been symbolized in dotted lines. For simplification, it has been assumed that load 2 is a purely resistive load, which results in that current Ic through capacitor C is substantially phase-shifted by 90° with respect to current I2 through the load. It should however be noted that this has no incidence upon the switch operation, provided that the current through capacitor C is different from zero when voltage Vac transits through zero.

A positive voltage pulse $V_{ON}$ is assumed to be applied between times t1 and t2 on terminal 6. The turning-on of triac T1 at time t1 causes the flowing of a current through the load and into capacitor C. Triac T1 turns off at the zero crossing that follows time t2 and does not turn back on at the next halfwave since the control pulse of voltage $V_{ON}$ has disappeared. However, triac K is restarted upon each halfwave due to current Ic in capacitor C.

A positive voltage pulse $V_{OFF}$ is assumed to be applied on terminal 7 at a time t3 to turn switch 1' off. At time t3, triac T2 turns off, which causes the discharge of capacitor C by bringing node 10 substantially down to ground N. Triac K opens at the end of the next halfwave (time t5). Since at the beginning of the next halfwave, capacitor C is charged and triac T1 is off, triac K does not turn back on.

FIG. 5 partially shows a third embodiment of a switch 1" according to the first aspect of the present invention. This embodiment differs from that discussed in relation with FIG. 3 by the fact that triacs T1 and T2 are replaced with thyristors Th1 and Th2. In FIG. 5, only the thyristors and resistor R2 have been shown, the rest of the switch being identical to that of FIG. 3.

The choice between triacs or thyristors to form the elementary switches of the switch control element depends on the application and, in particular, on the current operating conditions of the circuit.

One advantage of the triac is that it is bidirectional and thus enables a turning-off or a turning-on on negative or positive halfwaves of voltage Vac. However, the triac requires a significant gate current (generally on the order of 10 to 20 milliamperes). For example, triacs will be used when the control pulses can be of sufficiently short duration to reduce or minimize the power consumption despite this high gate current.

Thyristors have the advantage of requiring gate currents (generally on the order of 100μA) that are much smaller than those of a triac. However, they have the disadvantage of being unidirectional, which results in that the control pulses must be of a duration greater than the half-period of voltage Vac to guarantee a starting on a positive halfwave. For example, the use of thyristors will be chosen when the use of long pulses does not result in losing the benefit of a smaller control current as compared to the use of triacs.

It should be noted that in the embodiments of FIGS. 3 and 5, triac T2 or thyristor Th2 intrinsically fulfils the condition of waiting for the zero crossing of voltage Vac to turn off. Accordingly, the condition discussed in relation with FIG. 2, that elementary switch S2 be closed until the zero crossing of voltage Vac, requires no adaptation of signal $V_{OFF}$. The only condition to be fulfilled then is a duration sufficient to discharge capacitor C.

FIG. 6 schematically shows in the form of blocks an embodiment of a switch 20 according to a second aspect of the present invention. As previously, this switch includes two power terminals 3, 4 and is intended for being connected in series with a load 2 (Q) supplied by an A.C. voltage Vac. As in the first aspect of the present invention, switch 20 includes a bidirectional switching element K between terminals 3 and 4, this element being preferably formed of a triac. Switch 20 includes, as in the first aspect of the present invention, a terminal 8 intended for being connected to phase P of voltage Vac and, possibly, a terminal 9 intended for being connected to neutral N.

According to the second aspect of the present invention illustrated by FIG. 6, a circuit 21 for controlling element K is provided within switch 20. A feature of this circuit is, apart from directly drawing its power supply from voltage Vac, to include a single terminal 22 of control by a low-voltage pulse signal $V_{ON/OFF}$. Thus, according to the second embodiment of the present invention, switch 20 is controlled by a single signal and switches states upon each occurrence of a pulse on this single signal.

A feature of this control signal is to be synchronized on A.C. power supply Vac so that the turn-on (or turn-off) pulses are present on the positive (or negative) halfwaves of voltage Vac.

FIG. 7 shows an embodiment of a switch 20 according to the present invention.

The structure of the switch strongly resembles that discussed in relation with FIGS. 3 and 5. A first elementary switch of control element 21 is series-connected with a capacitor C and a resistor R1 between terminals 8 and 9. In the example of FIG. 7, this elementary switch is a thyristor Th1. It should however be noted that it could be a triac as in the embodiment of FIG. 3. Element K is, as previously, connected between terminals 3 and 4 and has its gate connected to node 11 between capacitor C and thyristor Th1. Similarly, a second elementary switch is connected in series with a resistor R2 between node 10, common to resistor R1 and capacitor C, and terminal 9.

A feature of the embodiment of FIG. 7 is that the second elementary switch is an anode-gate thyristor Th2' with an input triggering current, that is, the anode of thyristor Th2' is connected to terminal 9 while, in the embodiment of FIG. 5, the cathode of thyristor Th2 is connected to terminal 9.

The respective gates of thyristors Th1 and Th2' are connected via respective current-to-voltage conversion resistors R3 and R4 to common terminal 22 of application of low-voltage signal $V_{ON/OFF}$.

FIG. 8 very partially shows a second embodiment of a switch 20 according to the present invention that illustrates an embodiment of a switch S2' by means of a triac T2 in series with a diode D between terminal 9 and terminal 23 of resistor R2 opposite to terminal 10. Diode D aims at making triac T2 unidirectional so that the assembly of FIG. 8 functionally amounts to thyristor Th2' of FIG. 7.

FIGS. 9A to 9C illustrate, in the form of timing diagrams, the operation of a switch 20 according to the second aspect of the present invention. FIG. 9A shows an example of shape of current I2 through load 2. FIG. 9B shows current Ic through capacitor C. FIG. 9C shows the shape of voltage $V_{ON/OFF}$ applied on terminal 22.

In the example shown, the turning on of switch 20 occurs upon positive halfwaves of voltage Vac only. For simplification, it has been assumed that there is no phase shift between voltage Vac and the current in the load. It should however be noted that in case of a phase shift, the operation of the switch of the present invention would not be altered since the condition of having a non zero current in capacitor C at the zero crossing of voltage Vac remains fulfilled.

Switch 20 is assumed to be initially on and a positive voltage pulse on signal $V_{ON/OFF}$ (times t5 to t6) is assumed to occur during a positive halfwave of voltage Vac. At time t5, thyristor Th1 turns on, accordingly allowing the turning-on of triac K and the beginning of the charge of capacitor C. Independently from the duration of the pulse, thyristor Th1 turns off at a time t7 corresponding to the zero crossing of voltage Vac. However, triac K is restarted at the beginning of the following negative halfwave due to current Ic in capacitor C. It should be noted that the second elementary switch S2' could not turn on during the pulse on behalf of its unidirectionality.

To turn switch 20 off, a pulse (times t8 to t9) is generated on signal $V_{ON/OFF}$ during a negative halfwave of voltage Vac. As a result, thyristor Th1 remains off but thyristor Th2' (or triac T2) is turned on, thus causing the discharge of capacitor C. Accordingly, at the end of the involved negative halfwave time t10), when thyristor Th2' turns off independently from what has happened to the control signal pulse, triac K also turns off without being restartable since current Ic has disappeared.

The respective durations of the pulses of signal $V_{ON/OFF}$ must be sufficiently short so as not to overlap two halfwaves. Indeed, if the first turn-on halfwave lasts until the next negative halfwave, it will immediately turn the switch back off.

However, since the generation of the control signal pulses needs to be synchronized on voltage Vac, it is easy to make them appear sufficiently soon with respect to the halfwave according to their duration. The duration of the turn-off pulse is, as previously, conditioned by the time required by the discharge of capacitor C and the duration of the turn-on pulse is, as previously, conditioned by the duration necessary to the starting of triac K and the charge of capacitor C.

An advantage of the present invention is that it enables forming a stable high-voltage bidirectional switch controlled by a simple pulse for each state switching.

Another advantage of the present invention is that it reduces or minimizes the use of a possible microcontroller shared between the generation of the control signal necessary to the switch operation and other functions.

Another advantage of the present invention is that it reduces or minimizes the power dissipation due to the generation of the control signals. Indeed, the energy required to maintain an off or on state of the switch is now directly provided by the A.C. voltage, with no voltage conversion.

Resistor R1 must withstand the high A.C. voltage while resistor R2 sees at most the voltage across capacitor C. To choose resistor R1, a compromise is found between the need for a fast starting that requires a low value and a minimum power dissipation that requires a high value.

It should be noted that, in the case of a synchronized operation, the synchronization of the control signals is not a problem since this synchronization is performed on a signal (voltage Vac) that is present anyway.

It should also be noted that all the components of the switch according to the present invention are integrable, except, possibly, for resistor R1 and capacitor C.

The present invention is particularly advantageous in electric household applications, for example of washing machine type, in which several loads (engines, pumps, heating resistors, valves) must be controlled from the machine microcontroller. More generally, the present invention is particularly advantageous in any electric household appliance where low-voltage microcontrollers are more and more often present. A switch according to the present invention then replaces each conventional triac.

Of course, the present invention is likely to have various alterations, modifications, and improvements which will readily occur to those skilled in the art. In particular, the respective sizings of the various switch components depend on the application (in particular on the power and control currents and voltages) and on the desired characteristics in terms of consumption and dissipation. Further, the obtaining of low-voltage control signals of the switch and their possible synchronization have not been detailed, being within the abilities of those skilled in the art based on the functional indications given hereabove and on the desired operation. Moreover, although the present invention has been described hereabove in relation with thyristors or triacs, other components having equivalent functions may be used to form elementary switches of the switch control element.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A high-voltage bidirectional switch, including:
   a high-voltage bidirectional switching element for controlling a current through a load;
   a first elementary switch, responsive to a first pulse signal, for causing a capacitor to charge and for causing the bidirectional switching element to enter a first state which permits a current to flow through said load, the first elementary switch being series-connected with the capacitor and a first resistor; and
   a second elementary switch, responsive to a second pulse signal, for causing the capacitor to discharge and for causing the bidirectional switching element to enter a second state which inhibits a current flow through said load, the second elementary switch being series-connected with a second resistor, this series connection being connected in parallel with the series connection of the capacitor and the first elementary switch.

2. The bidirectional switch of claim 1, wherein said capacitor is sized to store a sufficient energy to restart the bidirectional switching element upon each halfwave of the A.C. voltage.

3. The bidirectional switch of claim 2, wherein said first elementary switch, when turned on, turns on the bidirectional switching element, and said second elementary switch, when turned on, discharges the capacitor to prevent an automatic triggering of said bidirectional switching element.

4. A high-voltage bidirectional switch, including:

a high-voltage bidirectional switching element; and first and second elementary switches for controlling the switching element in response to first and second pulse signals;

wherein the first elementary switch is responsive to the first pulse signal and is series-connected with a capacitor and a first resistor;

wherein the second elementary switch is responsive to the second pulse signal and is series-connected with a second resistor, this series connection being connected in parallel with the series connection of the capacitor and the first elementary switch wherein first and second power terminals of the bidirectional switch are coupled to an A.C. voltage; and wherein the frequency of the pulse signals is less than the frequency of the A.C. voltage, the duration of the pulses being less than the period of the A.C. voltage.

5. A high-voltage bidirectional switch, including:

a high-voltage bidirectional switching element; and first and second elementary switches for controlling the switching element in response to pulse signals;

wherein the first elementary switch is series-connected with a capacitor and a first resistor;

wherein the second elementary switch is series-connected with a second resistor, this series connection being connected in parallel with the series connection of the capacitor and the first elementary switch; and wherein the first and second elementary switches are controlled by a single control signal, each of the first and second elementary switches being unidirectional and corresponding to a specific conduction direction.

6. The bidirectional switch of claim 5, wherein the single control signal is synchronized on the A.C. voltage, the pulse signals appearing for a first sign of the A.C. voltage being intended for turning on the bidirectional switching element and the pulse signals appearing for a second sign of the A.C. voltage being intended for turning off the bidirectional switching element.

* * * * *